US007432584B2

United States Patent

(12) United States Patent
Goh et al.

(10) Patent No.: US 7,432,584 B2
(45) Date of Patent: Oct. 7, 2008

(54) LEADFRAME FOR USE IN A SEMICONDUCTOR PACKAGE

(75) Inventors: Koh Hoo Goh, Muar Johor (MY); Bun-Hin Keong, Muar Johor (MY)

(73) Assignee: Infineon Technologies, AG, Neubiberg (DE)

( * ) Notice: Subject to any disclaimer, the term of this patent is extended or adjusted under 35 U.S.C. 154(b) by 131 days.

(21) Appl. No.: 10/962,433

(22) Filed: Oct. 13, 2004

(65) Prior Publication Data

US 2005/0077598 A1 Apr. 14, 2005

(30) Foreign Application Priority Data

Oct. 13, 2003 (EP) ................................. 03023224

(51) Int. Cl.
*H01L 23/495* (2006.01)

(52) U.S. Cl. ...................... 257/666; 257/734; 257/750; 257/766; 257/E23.031; 257/E23.053

(58) Field of Classification Search ................. 257/666
See application file for complete search history.

(56) References Cited

U.S. PATENT DOCUMENTS 3,716,764 A 2/1973 Birchler et al.
4,034,027 A 7/1977 Smith, Jr.
4,707,354 A * 11/1987 Garlen et al. ................. 424/47
4,835,067 A 5/1989 Levine
5,122,858 A * 6/1992 Mahulikar et al. .......... 257/753
5,343,073 A * 8/1994 Parthasarathi et al. ....... 257/666
5,563,442 A * 10/1996 Mahulikar et al. .......... 257/666
5,710,064 A 1/1998 Song et al.
5,817,544 A * 10/1998 Parthasarathi ............... 438/123
5,838,062 A 11/1998 Hwang et al.
5,859,471 A 1/1999 Kuraishi et al.
5,929,511 A 7/1999 Nakazawa et al.
6,194,777 B1 2/2001 Abbott et al.
6,376,901 B1 4/2002 Abbott
6,545,342 B1 4/2003 Abbott
6,575,354 B2 * 6/2003 Tanaka et al. ............... 228/254
6,852,567 B1 * 2/2005 Lee et al. .................... 438/106
6,960,823 B2 * 11/2005 Miyaki et al. ............... 257/676
2002/0146864 A1 * 10/2002 Miyaki et al. ............... 438/123

FOREIGN PATENT DOCUMENTS

EP 0 335 608 B1 10/1989
EP 0 337 015 B1 10/1989
JP 63102247 5/1988
JP 092921377 A 11/1997
WO WO 00/74131 A1 * 12/2000

* cited by examiner

*Primary Examiner*—Evan Pert
*Assistant Examiner*—Eduardo A Rodela
(74) *Attorney, Agent, or Firm*—Edell, Shapiro & Finnan, LLC

(57) ABSTRACT

A leadframe comprises a die mounting area, a plurality of lead fingers and a metal deposit having a negative electrochemical potential with respect to a standard $H_2$ half cell. A semiconductor package comprises the leadframe and a semiconductor chip having a plurality of contact areas mounted to the die mounting area and electrically connected to the inner ends of the lead fingers of the leadframe by a plurality of bond wires. The semiconductor chip, the bond wires and inner portions of the lead fingers are encapsulated by a plastic housing.

10 Claims, 2 Drawing Sheets

1
11
4
5
5
7
2
12
8
10
9
4
6
3

1
11
4
5
5
7
2
12
8
10
9
4
6
3

200
250
230
206
240
205
201
202
230
201
201
203

LEADFRAME FOR USE IN A SEMICONDUCTOR PACKAGE

CROSS REFERENCE TO RELATED APPLICATIONS

This application claims priority under 35 U.S.C. §119 to European Application No. EP 03023224.3, filed on Oct. 13, 2003, and entitled "LEADFRAME," the disclosure of which is incorporated herein by reference in its entirety.

FIELD OF THE INVENTION

The present invention relates to a leadframe for use in a semi-conductor package.

BACKGROUND

Copper leadframes of encapsulated semiconductor packages can corrode during the manufacturing and assembly process. This is undesirable as oxidation and corrosion of the copper surface leads to poor electrical contacts between both the semiconductor chip and the leadframe, as well as, between the leadframe and the external circuit board.

One method of improving the reliability of semiconductor packages is to coat the copper leadframe with a thick silver coating. The silver coating takes up approximately 40% of the cost of the frame, thereby limiting potential future price reductions. More importantly, high quality silver coatings can be electroplated only by using cyanide-based plating solutions. The use of cyanide in manufacturing processes is undesirable because of its high toxicity and alternatives are sought.

U.S. Pat. No. 6,376,901 uses a series of electroplated coatings, first coating the whole leadframe with a Ni coating and in an additional two steps, selectively coating the leadframe with two palladium layers of different thickness. This process is undesirable in that at least three plating steps are required. In addition, palladium is also extremely expensive thus adding to the overall cost of the process.

U.S. Pat. No. 6,545,342 creates a coating over the entire copper leadframe by immersing the leadframe in a chromating solution. A percentage of the copper metal atoms are converted into substitutional metal complexes. The composition of this layer is very complicated and difficult to closely define. In addition, to produce a leadframe with the best properties, a copper layer must be initially deposited.

SUMMARY OF THE INVENTION

The present invention seeks to provide a more reliable semi-conductor package and relates to a metal leadframe strip which comprises a plurality of leadframes where each leadframe includes a die mounting area and a plurality of lead fingers. The leadframe includes a metal deposit having a negative electrochemical potential with respect to a standard $H_2$ half cell. Preferably, the leadframe comprises Cu or a Cu-alloy. The metal with a negative electrochemical potential with respect to a standard $H_2$ half cell comprises zinc, Pb, Sn, Ni, Fe, or Cr. The Cu and Cu-alloys are desirable for leadframes due to their ease of manufacture and their good electrical properties. The metal for the metal deposit is chosen in order to have the desired protective effect and prevent corrosion of the leadframe.

The metal deposit is positioned on a portion of the lead fingers. Preferably, the portion is situated less than approximately 1 mm, more preferably less than approximately 0.5 mm, and, even more preferably, less than approximately 0.1 mm from the bond contact position in order to have a protective effect.

Alternatively, the metal deposit may cover the whole leadframe apart from the areas directly around the bond contact position. Preferably, the metal deposit is positioned to within approximately 1 mm, more preferably to within approximately 0.5 mm, even more preferably to within approximately 0.1 mm of the bond contact position in order to increase its protective effect. The metal deposit may also be positioned on portions of the leadframe.

The invention also relates to a semiconductor package comprising a leadframe, a semiconductor chip having a plurality of contact areas mounted to the die mounting area, and electrically connected to the inner ends of the lead fingers of the leadframe by a plurality of bond wires. The semiconductor chip, bond wires and inner portion of the lead fingers are encapsulated by plastic, where the leadframe is in accordance with an embodiment of the present invention described above. The metal deposit may be arranged within, or at least partly within the housing or outside of the housing.

The present invention also relates to a method of assembling a semiconductor package. A metal strip is provided which is stamped or etched to create a series of leadframes. Each leadframe includes a die mounting area and a plurality of lead fingers. After the strip is cleaned and masked, a metal with a negative electrochemical potential with respect to that of a $H_2$ half cell is deposited on the leadframe strip.

A semiconductor chip is then attached to the die mounting area and electrical connections by, for example, bond wires, are made between the semiconductor chip and the inner end of the lead fingers. The die, bond wires and inner portion of the lead fingers are encapsulated. The external leads are plated with solder and then the individual packages are split from the leadframe strip. The external leads which are plated with solder enable the package to be easily soldered to an external circuit, such as a printed circuit board.

In accordance with a further embodiment of the present invention method, the metal deposit comprises Zn, Pb, Sn, Ni, Fe or Cr and the leadframe comprises Cu or a Cu-alloy. The metal can be deposited by electroplating although any depositing method can be employed. Electroplating is desirable in that it is cost-effective, fast, plating baths are readily available, masking processes are known and it is easily incorporated in the existing manufacturing process.

The leadframe is masked so as to deposit the metal on the desired areas. The metal deposit is positioned so as to prevent corrosion of the leadframe in a particular manufacturing process for a particular semiconductor package.

An uncontaminated surface on the contact areas enables good electrical connections between the chip and lead fingers and/or the package and the external circuit being manufactured. Additionally, during the die and wire bond processes a gas comprising $N_2$ and $H_2$, commonly known as forming gas, may be employed to further avoid the oxidation of copper.

The invention offers a further advantage in that the metal can be deposited in a single depositing step. Therefore, expensive metals and toxic plating baths do not need to be used.

The invention enables the bond wires from the chip to be bonded directly to the leadframe material. This is desirable in that this direct bonding avoids delamination of the metal coating from the contact area. Delamination of the metal coating results in a broken electrical contact rendering the semiconductor package un-usable. Also, since the metal deposit can be positioned on the leadframe in an area which must be protected (e.g., the contact areas), material use can be minimized. This enables, for example, more leadframes to be plated from the same plating bath, increasing manufacturing speeds and increasing reproducibility of the coatings.

BRIEF DESCRIPTION OF THE DRAWINGS

The invention will now be described by way of example with reference to the drawings.

DETAILED DESCRIPTION OF THE PREFERRED EMBODIMENTS

Figure 1:
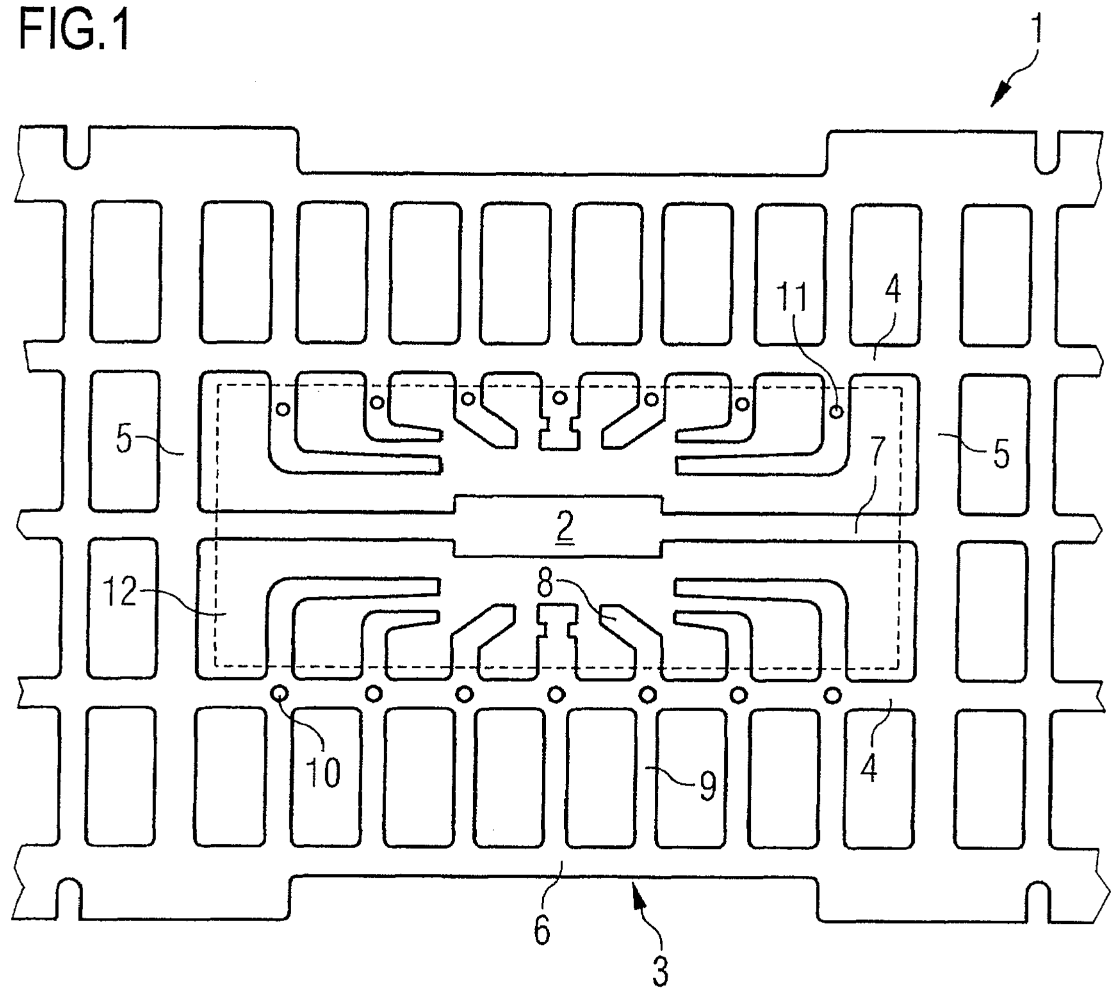
FIG. 1 shows the top view of a section of a leadframe strip including spots of zinc in an embodiment of the invention.

FIG. 1 shows the top view of a section of a copper leadframe strip including spots of zinc. The section of leadframe may be used to mount a semiconductor chip (not shown) in an encapsulated leadframe package (not shown).

A rectangular die mounting area 2 is located in the center of a section of leadframe strip 1 and it is surrounded by a plurality of lead fingers 3. There is an inner support rectangle including horizontal support bars 4 and vertical support bars 5 connecting the lead fingers 3 at a point along their length. An outer rectangular support frame 6 connects the outer ends of lead fingers 3. The die mounting area 2 is connected by two horizontal support bars 7 to support vertical support bars 5.

The support bars 4, 5, 6 and 7 are removed at the end of the manufacturing process to create a free-standing die mounting area 2 and separate lead fingers 3.

The central area of the leadframe including the die mounting area 2 and inner portion of lead fingers 3 may be encapsulated later on in the manufacturing process to form the semiconductor package (not shown). This area is shown in FIG. 1 by a dotted line 12. Contact area 8 of lead finger 3 is within the encapsulated package and is used for the electrical connections (not shown) from the chip (not shown) mounted on the die mounting area 2. Contact area 9 of lead finger 3 is outside the package and will form the contacts from the package to the printed circuit board (not shown).

Figure 3:
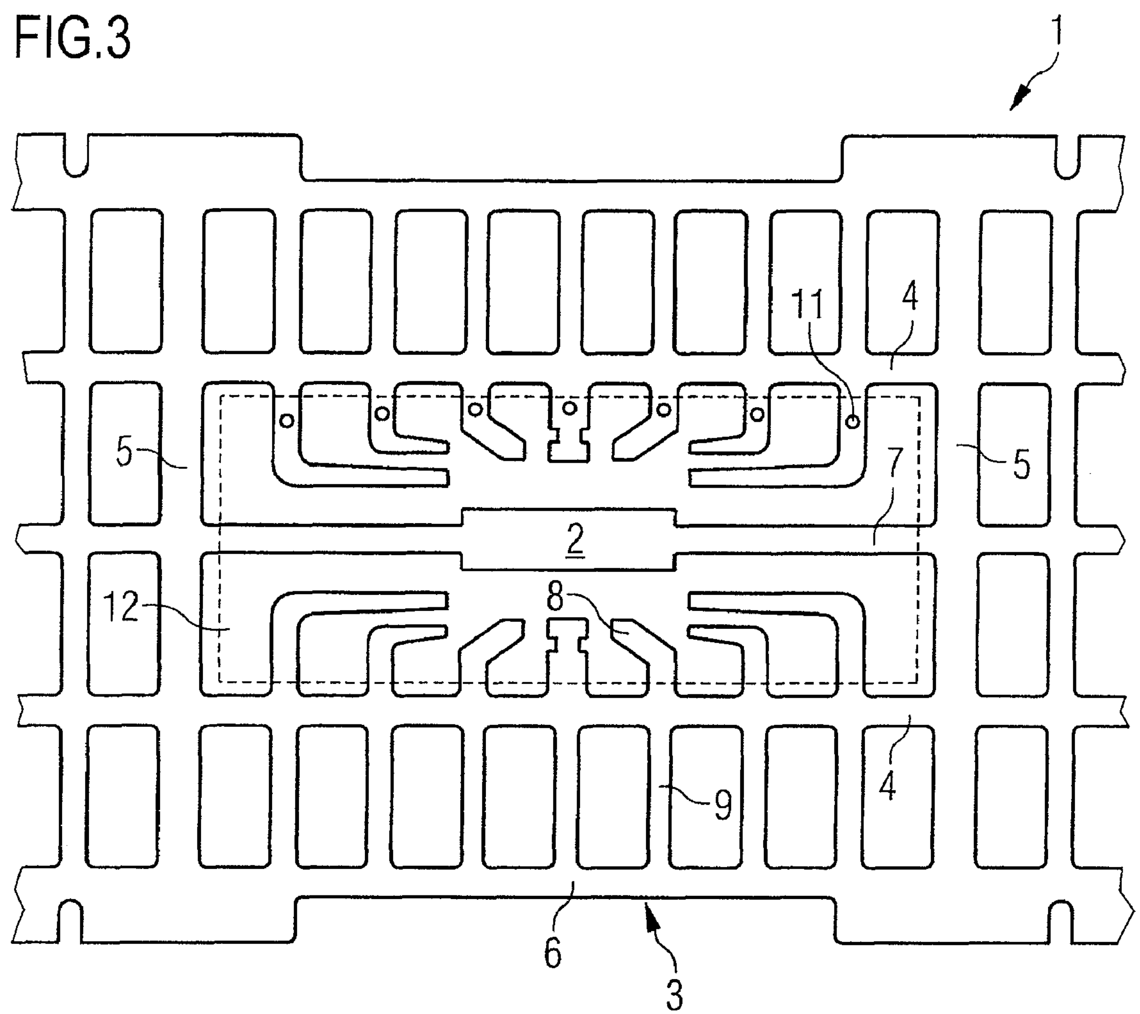
FIG. 3 shows the top view of a section of a leadframe strip including spots of zinc in another embodiment of the invention.

In accordance with an embodiment of the invention, spots of zinc 10 are located on lead fingers 3 at the intersection with support bar 4. The spots of zinc 10 are located outside of the area which is eventually covered to make an encapsulated semiconductor package (not shown). In another embodiment of the present invention, spots of zinc 11 are located on the lead fingers 3 at the outer end of contact area 8. Zinc spots 11 can also be within the final encapsulated semiconductor package (as shown in FIG. 3, where all of the zinc spots 11 are located within dotted line 12).

In an embodiment of the present invention, there is only a small zinc deposit positioned very close to the bonding position. The distance between the zinc deposit and the bond position is typically less than approximately 1 mm, preferably less than approximately 0.5 mm, or more preferably less than approximately 0.1 mm.

Figure 2:
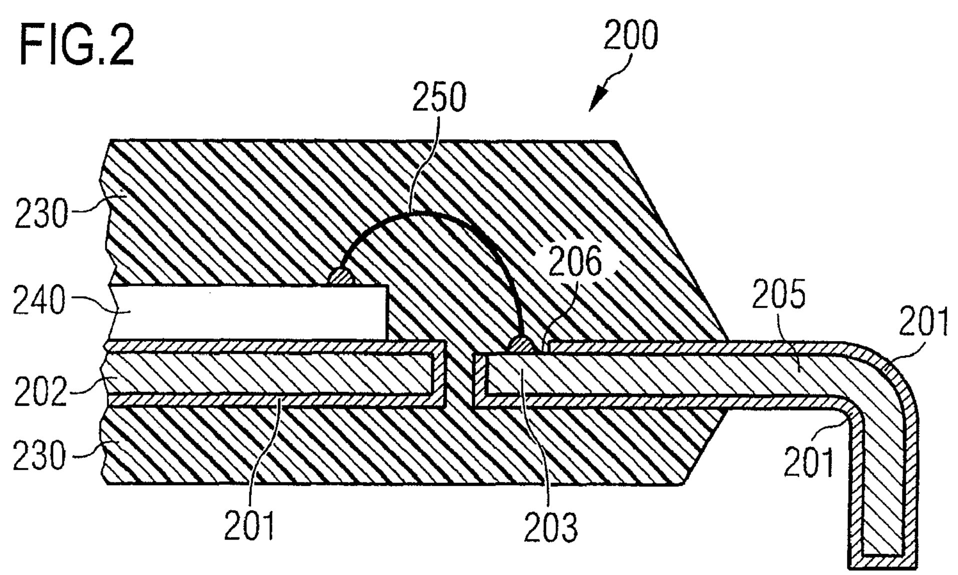
FIG. 2 shows a cross-sectional view of the right-hand side of an encapsulated leadframe package with a zinc coating in a further embodiment of the invention.

FIG. 2 shows a cross-sectional view of the right-hand side of an encapsulated leadframe package including a zinc coating in a further embodiment of the present invention. A semiconductor chip is mounted on a section of the leadframe and is wire bonded to a lead finger. The chip, wire and inner portion of the lead finger are encapsulated to form the package.

A semiconductor chip 240 is mounted on a central die mounting area 202 of the leadframe. The chip 240 is electrically connected to a lead finger 203 by bond wire 250. The semiconductor chip 240, bond wire 250 and inner part of the lead finger 203 are encapsulated by a plastic housing 230 to form package 200. The outer end 205 of the lead finger 203 remains outside of the encapsulated area. The die mounting area 202 and lead finger 203 are covered by a zinc coating 201 apart from a small bond contact area 206 at the inner end of lead finger 203, where the wire bond 250 is connected to the lead finger 203. Bond contact area 206 has no zinc coating.

The present invention employs the principle of a galvanic couple to prevent corrosion of the copper leadframe. The electrochemical or electrode potential of a half cell reaction is defined in relation to the half cell reaction for hydrogen, $H_2$. Reactions with a negative electrode potential in relation to $H_2$ are defined as anodes and are electron producers. Metals exhibiting such behaviour are also referred to as anodic materials. Reactions with a positive potential in relation to $H_2$ are defined as cathodes and are electron consumers. Metals exhibiting such behaviour are also referred to as cathodic materials.

In the present invention, areas of anodic materials such as zinc are deposited onto the copper leadframe. Typically, these zinc areas act as a sacrificial anode and preferentially oxidize and degrade, supplying electrons to the copper leadframe. The copper leadframe accepts the electrons supplied by the zinc, since the copper acts as a cathode, and thus corrosion of the copper leadframe is prevented. The sacrificial anode areas prevent the undesired corrosion of the contact areas of the copper leadframe during the die and wire bond attachment processes.

What is claimed is:

1. A metal leadframe strip comprising:
- a plurality of leadframes, each including:
  - a die mounting area;
  - a plurality of lead fingers; and
  - a zinc metal deposit comprising a plurality of zinc spots that are disposed on portions of the lead fingers while leaving other portions of the lead fingers exposed and not covered by zinc such that a majority of the surface area of each lead finger remains exposed and not covered by zinc, wherein each zinc spot consists essentially of zinc and does not include chromium.

2. A metal leadframe strip according to claim 1, wherein each leadframe includes one of Cu and a Cu alloy.

3. A metal leadframe strip according to claim 1, wherein the zinc metal deposit covers the leadframe apart from an area within a distance of at least one of approximately 1 mm, approximately 0.5 mm, and approximately 0.1 mm around a bond contact position.

4. A metal leadframe strip according to claim 1, wherein the zinc metal deposit is positioned only on portions of the leadframe.

5. The metal leadframe strip of claim 1, wherein at least some of the zinc spots are positioned on outer portions of the lead fingers.

6. The metal leadframe strip of claim 1, wherein the zinc spots serve as sacrificial anodes that are more susceptible to oxidation in relation to the exposed portions of the lead fingers.

7. A semiconductor package comprising:
- a metal leadframe comprising:
  - a die mounting area;

a plurality of lead fingers; and a zinc metal deposit comprising a plurality of zinc spots that are disposed on portions of the lead fingers while leaving other portions of the lead fingers exposed and not covered by zinc such that a majority of the surface area of each lead finger remains exposed and not covered by zinc, wherein each zinc spot consists essentially of zinc and does not include chromium;

a semiconductor chip including a plurality of contact areas mounted to the die mounting area and electrically connected to the inner ends of the lead fingers of the leadframe by a plurality of bond wires; and a plastic housing encapsulating the semiconductor chip, the bond wires and inner portions of the lead fingers, wherein at least a portion of zinc metal deposit is positioned within the plastic housing.

8. The semiconductor package of claim 7, wherein at least part of the zinc metal deposit is positioned outside of the plastic housing.

9. The semiconductor package of claim 7, wherein the zinc metal deposit is positioned entirely within the plastic housing.

10. The semiconductor package of claim 7, wherein at least some of the zinc spots are positioned on outer portions of the lead fingers.

* * * * *